United States Patent [19]

Kida et al.

[11] Patent Number: 4,558,346
[45] Date of Patent: Dec. 10, 1985

[54] HIGHLY RELIABLE HERMETICALLY SEALED PACKAGE FOR A SEMICONDUCTOR DEVICE

[75] Inventors: Susumu Kida, Tokyo; Hayato Usami, Inagi; Hideji Aoki, Machida, all of Japan

[73] Assignee: Fujitsu Limited, Kawasaki, Japan

[21] Appl. No.: 477,934

[22] Filed: Mar. 23, 1983

[30] Foreign Application Priority Data

Mar. 29, 1982 [JP]  Japan ................. 57-050734

[51] Int. Cl.[4] ................. H01L 21/60; H05K 1/09
[52] U.S. Cl. ......................... 357/74; 29/589; 357/71
[58] Field of Search ............ 357/74, 71, 67, 80, 357/68; 228/4.5, 123, 179; 428/601, 614, 620, 622; 29/589, 577

[56] References Cited

U.S. PATENT DOCUMENTS 4,447,857  5/1984  Marks et al. ................. 361/395

FOREIGN PATENT DOCUMENTS 55-27615  2/1980  Japan ................. 29/589
0153341  11/1980  Japan ................. 29/589
0054644  3/1983  Japan ................. 29/589

*Primary Examiner*—James W. Davie
*Assistant Examiner*—Vangelis Economou
*Attorney, Agent, or Firm*—Staas & Halsey

[57] ABSTRACT

A semiconductor device having a hermetically sealed package which includes a package substrate having a gold layer, an integrated-circuit chip attached to the gold layer, a terminal metal chip attached to the gold layer so as to ground the terminal metal chips leads, bonding wires, a cap, and glass layers for sealing the device. The terminal metal chip has a lower coating layer made of a gold-silicon type of alloy for attachment. The bond strength of the terminal metal chip is not decreased although a heat treatment is carried out to seal the glass.

7 Claims, 4 Drawing Figures

HIGHLY RELIABLE HERMETICALLY SEALED PACKAGE FOR A SEMICONDUCTOR DEVICE

BACKGROUND OF THE INVENTION

(1) Field of the Invention

The present invention relates to a semiconductor device comprising a hermetically sealed package and an integrated-circuit chip packed therein and more particularly to an improvement in the electrical connection between the lower surface of the chip and one of the leads of the package.

(2) Description of the Prior Art

In the process of producing a semiconductor device, a packaging step must be carried out. There are various kinds of well-known integrated-circuit packages in the art. For example, in the case of a dual in-line package (DIP), such as a so-called Cerdip, illustrated in FIGS. 1 and 2, a package substrate 1 of ceramic has a cavity in the center portion. A gold paste is applied on the bottom surface of the cavity and is heated at a temperature from 800° C. to 950° C. to form a gold layer 2. Then a glass paste having a low melting point is applied on the surface of the ceramic substrate 1, except for the cavity, and is pre-baked at a temperature of about 400° C. to form a glass layer 3. A lead frame which comprises leads 4 and is made of an Fe-Ni-Co alloy (e.g., Kovar) or an Fe-Ni-alloy (e.g., 42 Alloy) is set on the glass layer 3, and the ceramic substrate 1 is heated at a temperature of about 450° C. to melt the glass layer 3 so that the leads 4 stick to the glass layer 3. In order to attach an integrated-circuit chip 5 to the package substrate 1 while the substrate 1 is being heated at a temperature of from 400° C. to 450° C., the chip 5 is placed on the gold layer 2 in such a manner that the gold layer 2 is scrubbed with the chip 5. As a result, the silicon of the integrated-circuit chip 5 is alloyed with the gold of the gold layer 2 to form a eutectic brazing alloy having a low melting point. Therefore, by forming a brazing alloy, the chip can be attached to the package substrate 1.

In order to ground the integrated-circuit chip 5 at the lower surface thereof, generally, a terminal metal chip 6 is attached to the gold layer 2, prior to IC chip attaching step or a wire bonding step, to create predetermined electrical connections between the integrated-circuit chip 5 and the leads 4. If the terminal metal chip 6 is not provided, when an aluminum micro-wire (i.e., a bonding wire) is used to connect the gold layer 2 to a lead of the frame to be grounded, the aluminum and gold commonly form an intermetallic compound of purple or white plague during a sealing step carried out at a temperature from 400° C. to 500° C. The compound weakens the bond strength and decreases the electric conductivity, with the result that bond failure may occur. The terminal metal chip 6 comprises, e.g., a metal base 7 being e.g., of an Fe-Ni-Co alloy or an Fe-Ni alloy, an aluminum-silicon (AlSi) alloy or aluminum (Al) thin layer 8 formed on the upper surface of the base 7, and a gold-germanium (AuGe) alloy thin layer 9 formed on the lower surface of the base 7, as is illustrated in FIG. 3. Such a terminal metal chip is disclosed in Japanese Unexamined Patent Publication No. 55-27615. The terminal metal chip 6 can be produced by putting an Al or AlSi film and a AuGe film on the upper surface and the lower surface of a metal plate, respectively, rolling the films with pressure rollers to form a laminated plate, and punching the plate. The obtained metal chip has a predetermined shape, e.g., a circular shape, a rectangular shape, etc. In order to attach the terminal metal chip 6 to the package substrate 1 while the substrate 1 is being heated at a temperature from 400° C. to 450° C., the chip 6 is put on the gold layer 2 so as to bring the AuGe layer 9 in contact with the gold layer 2. Then the gold layer 2 is scrubbed with the chip 6. As a result, the AuGe layer 9 and the gold layer 2 are melted and alloyed. After cooling, the chip 6 sticks to the gold layer 2, i.e., the substrate 1. Then aluminum wires 10 are attached between bonding pads (i.e., contact areas) 11 of the integrated-circuit chip 5 and the terminal areas of the leads 4 by using an ultrasonic bonding technique, as is illustrated in FIGS. 1 and 2. During the wire bonding step, an aluminum wire 12 is also attached between the Al or AlSi layer 8 of the terminal metal chip 6 and a predetermined lead 4A. Therefore, the integrated-circuit chip 5 can be grounded via the terminal metal chip 6.

Finally, a ceramic cap 13 (FIG. 1) with a pre-baked glass layer 14 having a low melting point is put on the glass layer 3 and the lead 4, and the substrate 1 and the cap 13 are heated at a temperature from 400° C. to 500° C. in a furnace. Since the glass layer 14 has a low melting point similar to that of the glass layer 3 the layer 4 is made of the same material as is the layer 3, the glass layers 14 and 3 melted and are combined into a sealing glass layer. After cooling, a hermetically sealed package is produced.

However, the present inventors found that when the terminal metal chip 6 was bonded to the package substrate 1 the bond strength was remarkably reduced because the AuGe alloy layer between the terminal metal chip 6 and the gold layer 2 alloyed with silicon, which diffused from the integrated-circuit chip 5 through the gold layer 2 during the heat treatment for sealing, to form a gold-germanium-silicon (AuGeSi) alloy. A reduction in the bond strength may result in bond failure and thus decrease the reliability of the semiconductor device.

SUMMARY OF THE INVENTION

An object of the present invention is to prevent the bond strength of a terminal metal chip from deteriorating.

Another object of the present invention is to provide a semiconductor device having a highly reliable hermetically sealed package.

These and other objects of the present invention can be achieved by providing a semiconductor device comprising a package substrate having a gold layer, an integrated-circuit chip attached to the gold layer, a terminal metal chip attached to the gold layer, and bonding wires. According to the present invention, the terminal metal chip being provided with a lower coating layer made of a gold-silicon (AuSi) type of alloy and joined to the gold layer.

It is preferable that the AuSi type of alloy coating layer be a AuSi alloy or a AuGeSi alloy. It is preferable that the silicon content of the AuSi alloy be from 1.0 to 8.0 wt %, taking the melting point (370° C.) of the AuSi eutectic alloy into consideration.

In a case where the lower coating layer of the AuGeSi alloy is formed on a metal base of the terminal metal chip and the obtained terminal metal clip is attached to the gold layer of the package substrate and then heated in the sealing step, the present inventors found that the bond strength of the terminal metal chip is not decreased although in the case of the prior art bond strength of a terminal metal chip with a AuGe alloy coating layer is decreased by heating during the sealing step. It is preferable that the silicon content and the germanium content of the AuGeSi alloy be from 0.3 to 3 wt % and not more than 12 wt %, respectively.

DESCRIPTION OF THE PREFERRED EMBODIMENTS

Figure 3:
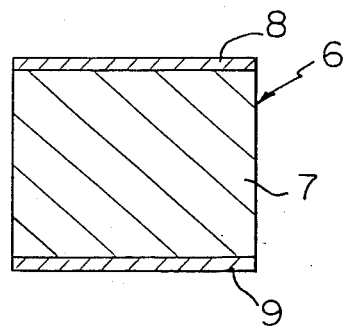
FIG. 3 is an enlarged sectional view of a terminal metal chip.

Three types of terminal metal chips 6 having the same dimensions are prepared in the above-mentioned manner. As is illustrated in FIG. 3, the terminal metal chips 6 each comprise a metal base 7 having a thickness similar to the thickness of an integrated-circuit chip, e.g., about 0.5 mm, an upper coating layer 8 having a thickness from 5 to 15 $\mu$m, e.g., about 10 $\mu$m, and a lower coating layer 9 having a thickness from 25 to 35 $\mu$m, e.g., about 30 $\mu$m. The plane shape of the terminal metal chips 6 is a desired form, e.g., a circle having a diameter of 0.9 mm. The metal base 7 and the upper coating layer 8 of all of the terminal metal chips are made of a Fe-Ni-Co alloy and an AlSi alloy, respectively. The lower coating layer 9 is made of a AuSi alloy in a first terminal metal chip, is made of a AuGeSi alloy in a second terminal metal chip, and is made of a AuGe alloy in a third terminal metal chip. The first and second terminal metal chips are embodiments of the present invention, and the third terminal metal chip is a conventional chip.

Figure 1:
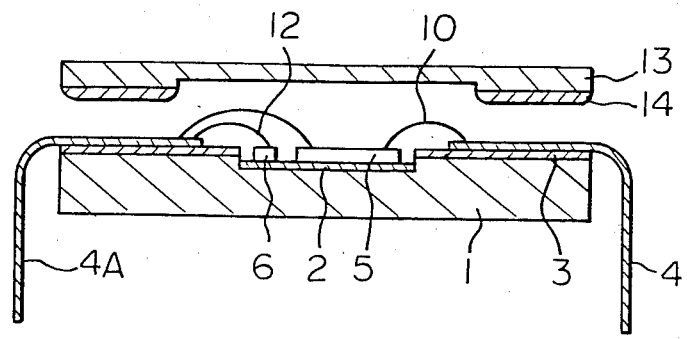
FIG. 1 is a sectional view of a Cerdip semiconductor device.
Figure 2:
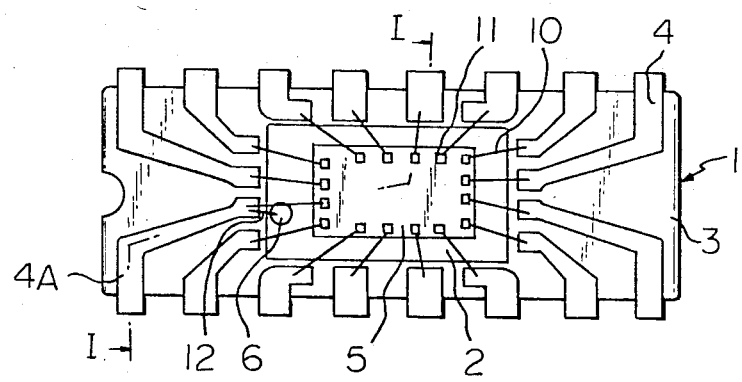
FIG. 2 is a plan view of the Cerdip semiconductor device, in which a ceramic cap is omitted, of FIG. 1.

Each of three types of terminal metal chips is attached to the gold layer 2 formed on the package substrate 1 (FIGS. 1 and 2) by scrubbing while the substrate 1 is being heated at a temperature of 430° C. and after the integrated-circuit chip 5 of silicon is attached to the gold layer 2. After cooling, all of the package substrates, along with the terminal metal chips, are heated at a temperature of 450° C. This heat treatment is carried out under the same conditions as those in the case of glass sealing.

Figure 4:
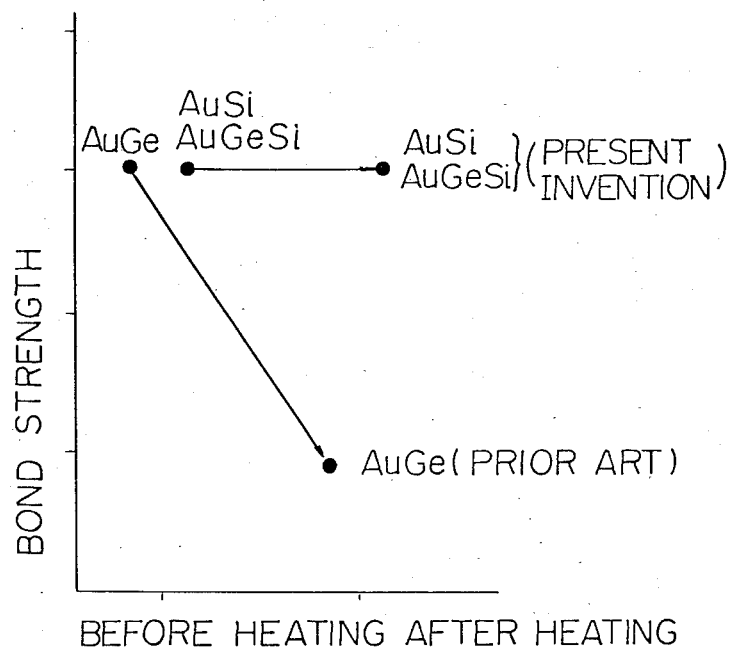
FIG. 4 is a diagram showing the bond strength of the prior art and the present invention terminal metal chips.

The bond strength of the terminal metal chips is measured by applying a force to each of the terminal metal chips in a horizontal direction in an attempt to remove the chip both before and after heating. The measurement results are shown in FIG. 4. As is evident from FIG. 4, before the heating step, the bond strength of the first, second, and third terminal metal chips is almost the same. After the heating step, the bond strength of the first and second terminal metal chips having AuSi and AuGeSi lower coating layers, respectively, is not decreased substantially, but the bond strength of the third terminal metal chip having a AuGe layer is remarkably decreased to about one third the initial value. Accordingly, the lower coating layer is made of a AuSi type of alloy in accordance with the present invention instead of a AuGe alloy, so that a decrease in the bond strength of the terminal metal chip can be prevented.

It is obvious that persons of skill in the art can easily produce a semiconductor device having a hermetically sealed package having the terminal metal chip of the present invention, in a conventional manner. The produced semiconductor device has improved reliability in comparison with a conventional semiconductor device.

It will be obvious that the present invention is not restricted to the above-described embodiments and that many variations are possible for persons of skill in the art, without departing from the spirit and scope of the invention.

We claim:

1. A semiconductor device comprising:
    a package substrate having a gold layer and terminal areas;
    an integrated circuit chip formed of silicon, attached to said gold layer and having a plurality of bonding pads formed thereon;
    a terminal metal chip attached to said gold layer, comprising:
        a metal base having first and second surfaces;
        an upper coating layer formed on said first surface of said metal base, of a metal selected from the group consisting of aluminum and an aluminum-silicon alloy; and
        a lower coating layer formed on said second surface of said metal base, made of a gold-silicon type of alloy and joined to said gold layer, said upper and lower coating layers applied to said metal base before said terminal metal chip is attached to said gold layer; and
    bonding wires electrically connecting said terminal areas to said upper coating layer of said terminal metal chip and to said bonding pads of said integrated-circuit chip.

2. A semiconductor device according to claim 1, wherein said metal base is made of a metal selected from the group consisting of an iron-nickel-cobalt alloy and an iron-nickel alloy.

3. A semiconductor device according to claim 1, wherein said gold-silicon type of alloy is a metal selected from the group consisting of a gold-silicon alloy and a gold-germanium-silicon alloy.

4. A terminal connected to an integrated circuit device comprising:
    a metal base having first and second surfaces;
    an upper coating layer, formed on said first surface of said metal base, of a metal selected from the group consisting of aluminum and an aluminum silicon alloy; and
    a lower coating layer, formed on said second surface of said metal base and operatively connected to the integrated circuit device, of a gold-silicon type of alloy.

5. A terminal according to claim 4, wherein said metal base is approximately 0.5 mm thick.

6. A terminal according to claim 4, wherein said upper coating layer has a thickness of from 5 to 15 $\mu$m.

7. A terminal according to claim 4, wherein said lower coating layer has a thickness of from 25 to 35 $\mu$m.

* * * * *

UNITED STATES PATENT AND TRADEMARK OFFICE
CERTIFICATE OF CORRECTION

PATENT NO. : 4,558,346
DATED : DECEMBER 10, 1985
INVENTOR(S) : SUSUMU KIDA ET AL.

It is certified that error appears in the above-identified patent and that said Letters Patent is hereby corrected as shown below:

```
FRONT PAGE, [57] ABSTRACT, line 5, after "chips" insert
                         --,--.

Col. 1, line 43, after "prior to" insert --the--.

Col. 2, line 21, "lead" should be --leads--;
        line 24, "4" should be --14--;
        line 26, after "3" insert --are--;
        line 26, "are combined" should be --combined--;
        line 55, "being" should be --is--.

Col. 3, line 39, after "of" (first occurrence) insert
                 --the--.
```

Signed and Sealed this

Fourth Day of March 1986

[SEAL]

Attest:

DONALD J. QUIGG

Attesting Officer

Commissioner of Patents and Trademarks